United States Patent
Pahlevaninezhad et al.

(10) Patent No.: US 11,916,157 B2
(45) Date of Patent: Feb. 27, 2024

(54) HYBRID-ENERGY APPARATUS, SYSTEM, AND METHOD THEREFOR

(71) Applicant: 10644137 CANADA INC., Calgary (CA)

(72) Inventors: Majid Pahlevaninezhad, Calgary (CA); Sam Scherwitz, Calgary (CA)

(73) Assignee: 10644137 CANADA INC., Calgary (CA)

( * ) Notice: Subject to any disclaimer, the term of this patent is extended or adjusted under 35 U.S.C. 154(b) by 21 days.

(21) Appl. No.: 17/602,564

(22) PCT Filed: Apr. 9, 2020

(86) PCT No.: PCT/CA2020/050482
§ 371 (c)(1),
(2) Date: Oct. 8, 2021

(87) PCT Pub. No.: WO2020/206554
PCT Pub. Date: Oct. 15, 2020

(65) Prior Publication Data
US 2022/0149218 A1    May 12, 2022

Related U.S. Application Data

(60) Provisional application No. 62/831,828, filed on Apr. 10, 2019.

(51) Int. Cl.
*H01L 31/0468* (2014.01)
*H01L 31/053* (2014.01)
(Continued)

(52) U.S. Cl.
CPC ......... *H01L 31/0468* (2014.12); *H01G 11/08* (2013.01); *H01L 31/022483* (2013.01);
(Continued)

(58) Field of Classification Search
CPC ......... H01L 31/053; H01L 51/42–4299; H01L 31/054; H02S 40/30–32; H02S 40/38
See application file for complete search history.

(56) References Cited

U.S. PATENT DOCUMENTS

| | | | |
|---|---|---|---|
| 6,274,860 B1 * | 8/2001 | Rosenberg | F24S 50/20 257/E31.127 |
| 2006/0268493 A1 * | 11/2006 | Miyasaka | H01L 28/40 429/111 |

(Continued)

FOREIGN PATENT DOCUMENTS

WO    2012/079159 A1    6/2012

OTHER PUBLICATIONS

H-J Ha et al., "UV-curale semi-interpenetrating polymer network-integrated highly bendable plastic crystal composite electrolytes for shape-conformable all-solid-state lithium ion batteries", Energy and Environmental Science 5, p. 6491-6499 (Year: 2012).*

(Continued)

*Primary Examiner* — Ryan S Cannon
(74) *Attorney, Agent, or Firm* — Osha Bergman Watanabe & Burton LLP

(57) ABSTRACT

A multi-layer apparatus has a transparent or semi-transparent substrate, a solar-cell layer coupled to the substrate, an energy-storage layer coupled to the solar-cell layer, and a converter layer coupled to the energy-storage layer. The solar-cell layer has a plurality of solar cells for receiving light through the substrate and converting energy of the received light to a first electrical energy, the energy-storage layer has one or more energy-storage units for storing a second electrical energy, and the converter layer has one or more power converters electrically connected to the solar-cell layer and the energy-storage layer for receiving the first (Continued)

electrical energy and the second electrical energy therefrom and outputting a third electrical energy via an output thereof.

26 Claims, 12 Drawing Sheets

(51) Int. Cl.
*H02S 40/38* (2014.01)
*H01G 11/08* (2013.01)
*H01L 31/0224* (2006.01)
*H02S 40/32* (2014.01)

(52) U.S. Cl.
CPC ............ *H01L 31/053* (2014.12); *H02S 40/38* (2014.12); *H02S 40/32* (2014.12)

(56) References Cited

U.S. PATENT DOCUMENTS

| | | | | |
|---|---|---|---|---|
| 2007/0148548 A1* | 6/2007 | Suzuki | ................ | H01M 10/052 |
| | | | | 429/231.95 |
| 2010/0068621 A1* | 3/2010 | Exnar | ................... | H01M 4/362 |
| | | | | 429/212 |
| 2012/0135512 A1* | 5/2012 | Vasylyev | ............ | H01L 31/0547 |
| | | | | 422/186.3 |
| 2013/0249293 A1* | 9/2013 | Yang | ................. | H01L 31/02021 |
| | | | | 257/E31.117 |
| 2015/0047710 A1* | 2/2015 | Narayan | ............. | H01L 51/4253 |
| | | | | 136/263 |
| 2015/0200311 A1 | 7/2015 | Bredel et al. | | |
| 2015/0349333 A1* | 12/2015 | Park | ....................... | H01M 4/485 |
| | | | | 429/215 |
| 2016/0020348 A1* | 1/2016 | Lee-Bouhours | ...... | G01J 3/1804 |
| | | | | 136/246 |
| 2016/0099369 A1 | 4/2016 | Eickelmann et al. | | |
| 2019/0203016 A1* | 7/2019 | Choi | ........................ | C08K 5/14 |
| 2019/0260016 A1* | 8/2019 | Wong | .................... | H01M 4/139 |
| 2020/0203677 A1* | 6/2020 | Lee | ....................... | H01M 50/116 |

OTHER PUBLICATIONS

J. A. Cooper, Q. D. Qian, M. R. Melloch, "Evidence of long-term storage of minority carriers in N+-GaAs/AlGaAs/P-GaAs MIS capacitors", IEEE Electron Device Letters 7, 6, p. 374-376 (Year: 1986).*

International Search Report issued in corresponding PCT Application No. PCT/CA2020/050482 dated Jun. 22, 2020 (4 pages).

Written Opinion of the International Searching Authority issued in corresponding PCT Application No. PCT/CA2020/050482 dated Jun. 22, 2020 (5 pages).

* cited by examiner

HYBRID-ENERGY APPARATUS, SYSTEM, AND METHOD THEREFOR

CROSS-REFERENCE TO RELATED APPLICATIONS

This application claims the benefit of U.S. Provisional Patent Application Ser. No. 62/831,828, filed Apr. 10, 2019, the content of which is incorporated herein by reference in its entirety.

FIELD OF THE DISCLOSURE

The present disclosure relates to energy apparatuses, systems, and methods therefor, and in particular to apparatuses and systems integrating hybrid-energy sources such as solar cells and batteries for providing electrical energy for various applications.

BACKGROUND

Solar energy has been used as a clean and practical energy source for various applications. For example, solar panels may be deployed at sunny locations such as rooftop for collecting solar energy and converting collected solar energy to electrical power for powering various electrical devices. Solar panels of various forms, styles, and sizes have been widely used as the energy-source components of various devices such as solar tiles, phone chargers, residential appliances, industrial equipment, and the like.

For example, FIGS. 1 to 3 show some prior-art solar-energy harvesting systems collectively denoted using reference numeral 10. In the solar-energy harvesting system 10 shown in FIG. 1, a solar panel 12 or more specifically a photovoltaic (PV) panel is used to convert solar energy to electricity and output it to an electronic power converter 14. The electronic power converter 14 converts the received electricity to a usable form for powering a load 16.

The electronic power converter 14 is also connected to an Alternative-Current (AC) utility grid 20 via a switch 18. Therefore, when the switch 18 is closed, the electronic power converter 14 may output power to the AC utility grid 20 for powering various devices (not shown) electrically connected thereto or for using the AC utility grid 20 to power the load 16 when the output of the electronic power converter 14 is insufficient.

Energy storage may be used for providing reliability to the system 10. As shown in FIG. 2, the prior-art system 10 in this example further comprises an energy storage 22 such as a battery assembly connecting to the load 16 and the AC utility grid 20 via another electronic power converter 24. With the use of the battery assembly 22, the system 10 may compensate for the intermittent nature of the solar-energy output from the PV panel 12 and improve the system reliability.

FIG. 3 shows a prior-art solar-energy harvesting system 10 similar to that shown in FIG. 2 but connected to a load 16 and a Direct-Current (DC) utility grid 26 instead of the AC utility grid 20.

The prior-art solar-energy harvesting systems have disadvantages and/or challenges such as:
  Unreliability in solar-energy generation due to the intermittency of sunlight.
  There is a wide range of variations in the operating points (e.g., voltage, current, and/or the like) of solar energy harvesting systems as the solar irradiance varies during the day, which significantly degrades the overall efficiency of the system.
  The system usually requires a utility power grid in order to provide resiliency for the system, i.e., requiring the utility power grid for providing power to various loads when solar energy is insufficient or unavailable.

Due to these disadvantages and/or challenges, prior-art solar-energy harvesting systems may not provide an optimal solution for many emerging applications such as solar tiles, solar chargers, and the like. Thus, prior-art solar-energy harvesting systems with suboptimal or even non-optimized performances would adversely impact the otherwise fast growth of solar-energy systems. Therefore, there is a desire for a reliable solar-energy harvesting solution.

SUMMARY

Embodiments of this disclosure relate to a hybrid-energy apparatus or module that integrates solar cells, battery cells, and in some embodiments electronic circuits in an efficient and reliable manner, resulting in a reliable energy apparatus or module with high efficiency.

According to one aspect of this disclosure, there is provided a multi-layer energy apparatus comprises: a transparent or semi-transparent substrate; a solar-cell layer coupled to the substrate, the solar-cell layer comprising a plurality of solar cells for receiving light through the substrate and converting energy of the received light to a first electrical energy; an energy-storage layer coupled to the solar-cell layer, the energy-storage layer comprising one or more energy-storage units for storing a second electrical energy; and a converter layer coupled to the energy-storage layer, the converter layer comprising one or more power converters electrically connected to the solar-cell layer and the energy-storage layer for receiving the first electrical energy and the second electrical energy therefrom and outputting a third electrical energy through an output thereof.

In some embodiments, the substrate comprises a layer of glass.

In some embodiments, the substrate comprises a flexible, transparent or semi-transparent material.

In some embodiments, the substrate comprises a transparent or semi-transparent plastic material.

In some embodiments, the substrate comprises at least one of polyethylene terephthalate (PET) and poly(ether sulfones) (PES).

In some embodiments, the solar-cell layer is printed or deposited to the substrate.

In some embodiments, the energy-storage layer is printed or deposited to the solar-cell layer.

In some embodiments, the solar-cell layer comprises: an anode sublayer coupled to the substrate; a sublayer of zinc oxide (ZnO) coupled to the anode sublayer; a sublayer of poly(ethylenimine) and poly(ethylenimine) ethoxylated (PETE) coupled to the sublayer of ZnO; a sublayer of organic solar cells coupled to the sublayer of PEIE; a sublayer of molybdenum trioxide ($MoO_3$) coupled to the sublayer of solar cells; and a cathode sublayer coupled to the sublayer of $MoO_3$.

In some embodiments, the anode sublayer comprises indium tin oxide (ITO).

In some embodiments, the cathode sublayer comprises silver (Ag) or aluminum (Al).

In some embodiments, the sublayer of solar cells comprises polymer solar cells.

In some embodiments, the sublayer of solar cells comprises a sublayer of bulk heterojunctions (BHJs).

In some embodiments, the energy-storage layer comprises at least one of one or more battery cells and one or more semiconductor capacitors.

In some embodiments, each of the one or more battery cells comprises: a first current-collector sublayer; an anode sublayer coupled to the first current-collector sublayers; a solid-state electrolyte sublayer coupled to the anode sublayer; a cathode sublayer coupled to the solid-state electrolyte sublayer; and a second current-collector sublayer coupled to the cathode sublayer.

In some embodiments, at least one of the first and the second current-collector sublayers comprises aluminum.

In some embodiments, the solid-state electrolyte sublayer comprises LiBF4 with $Al_2O_3$ and a first semi-interpenetrating polymer network (semi-IPN) skeleton material.

In some embodiments, the solid-state electrolyte sublayer is made of 1 Molar (mol per liter) $LiBF_4$ in Sebaconitrile (SBN) and a first semi-IPN skeleton material at a ratio of 85/15 weight-by-weight (w/w), mixed with about 300 Molar $Al_2O_3$ at a ratio of 60/40 w/w.

In some embodiments, the anode sublayer comprises activated $Li_4Ti_5O_{12}$ (LTO) with a first carbon material and a second semi-IPN skeleton material.

In some embodiments, the cathode sublayer comprises activated $LiCoO_2$ (LCO) with a second carbon material and a third semi-IPN skeleton material.

In some embodiments, the first and/or the second carbon comprises at least one of single-walled carbon nanotubes (SWCNT) and carbon powder.

In some embodiments, the activated LTO is SWCNT-coated LTO.

In some embodiments, the activated LCO is SWCNT-coated LCO.

In some embodiments, the semi-IPN skeleton material comprises an ultraviolet (UV) curable polymer.

In some embodiments, the UV-curable polymer comprises ethoxylated trimethylolpropane triacrylate (ETPTA) incorporating 1.0 weight percent (wt %) 2-hydroxy-2-methylpropiophenone (HMPP) and poly(vinylidene fluoride-co-hexafluoropropylene) (PVdF-HFP) with HFP of six mole percent (mol %) and ETPTA/PVdF-HFP at a ratio of 75/25 weight-by-weight (w/w).

In some embodiments, each of the one or more semiconductor capacitors comprise n sublayers of aluminum gallium arsenide (AlGaAs) interleaved with (n+1) sublayers of gallium arsenide (GaAs), n>0 being an integer, with each AlGaAs sublayer sandwiched between two neighboring GaAs sublayers.

In some embodiments, the converter layer comprises a multi-input electronic power converter having a solar-input converter, a battery-input converter, and an output converter.

In some embodiments, at least one of the solar-input converter, the battery-input converter, and the output converter comprises coils winding about a ferromagnetic or ferrimagnetic core.

In some embodiments, at least one of the solar-input converter, the battery-input converter, and the output converter comprises a core layer made of a ferrite material and sandwiched between two wiring layers; each of the wiring layers comprises electrically conductive wirings on a base; and the wirings of the two wiring layers are interconnected through one or more vias thereon to form the coils winding about the ferrite core.

BRIEF DESCRIPTION OF THE DRAWINGS

The embodiments of the present disclosure will now be described with reference to the following figures in which identical reference numerals in different figures indicate identical elements, and in which.

DETAILED DESCRIPTION

Figure 1:
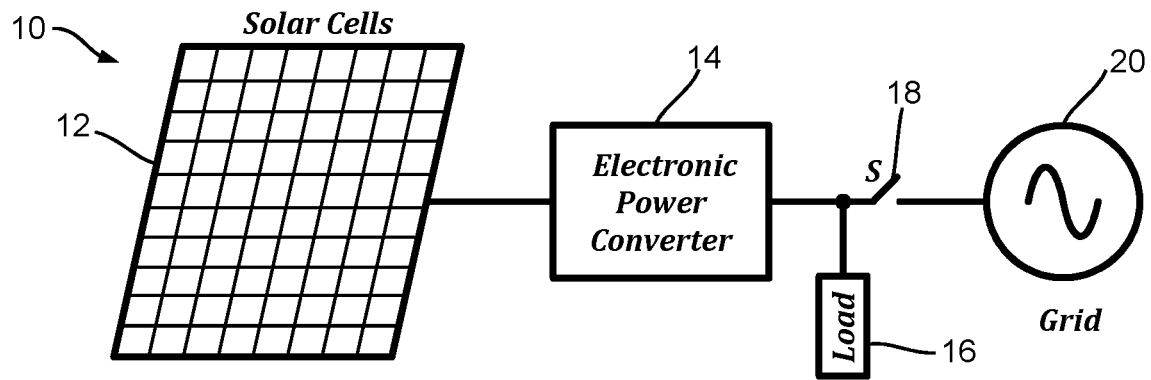
FIG. 1 is a schematic diagram showing a prior-art solar-energy harvesting system connecting to a load and/or an Alternative-Current (AC) utility grid, the solar-energy harvesting system having a solar panel for harvesting solar energy.
Figure 2:
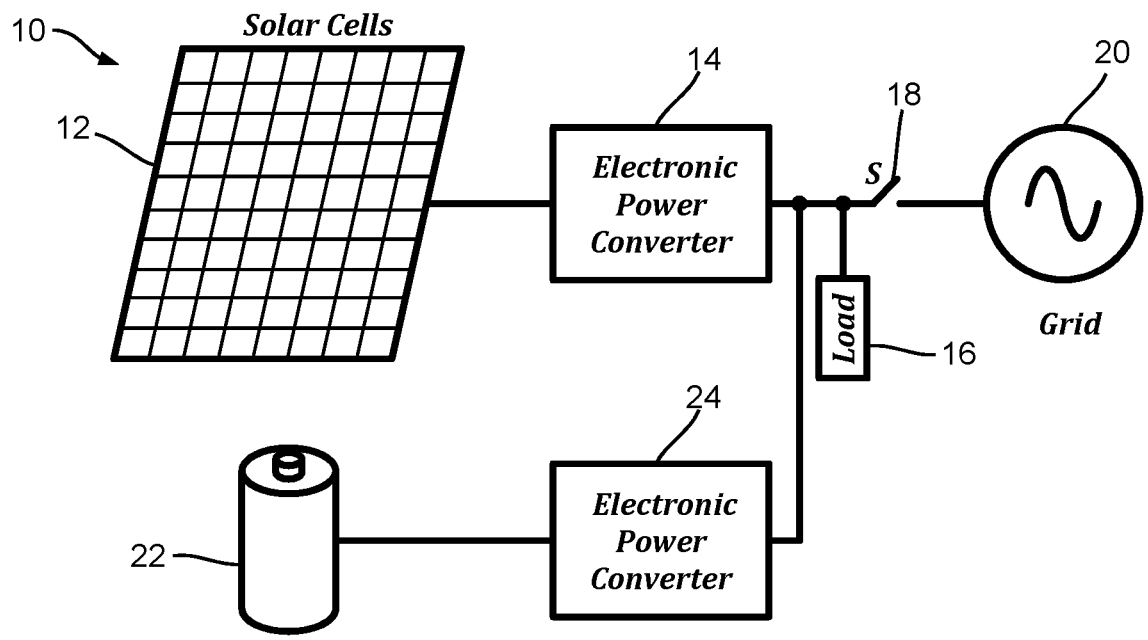
FIG. 2 is a schematic diagram showing a prior-art solar-energy harvesting system connecting to a load and/or connecting to an AC utility grid, the solar-energy harvesting system having a solar panel and an energy storage.
Figure 3:
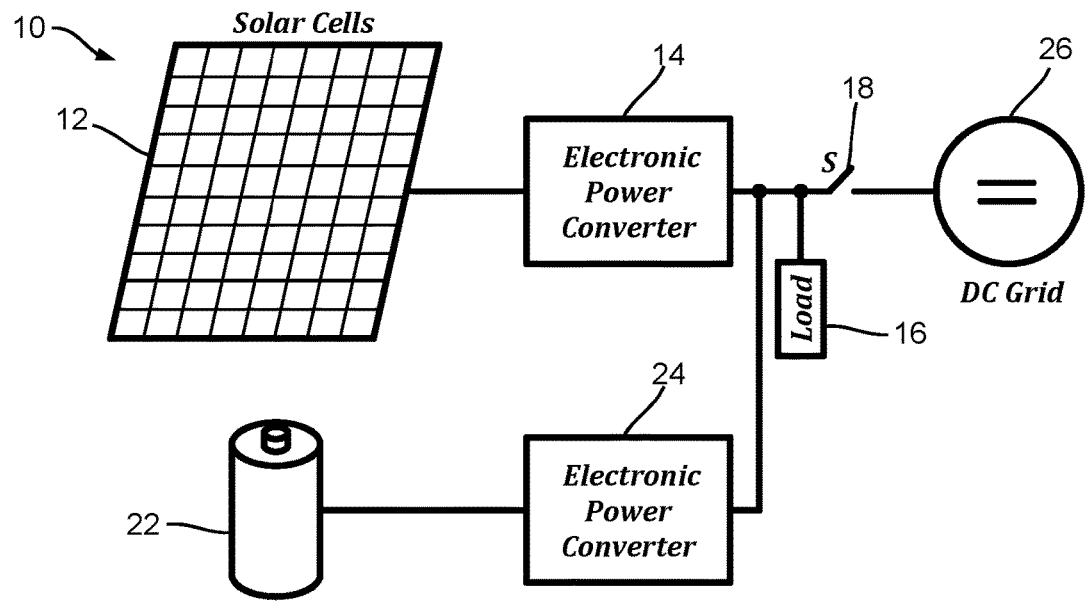
FIG. 3 is a schematic diagram showing a prior-art solar-energy harvesting system connecting to a load and/or a Direct-Current (DC) utility grid, the solar-energy harvesting system having a solar panel and an energy storage.
Figure 4:
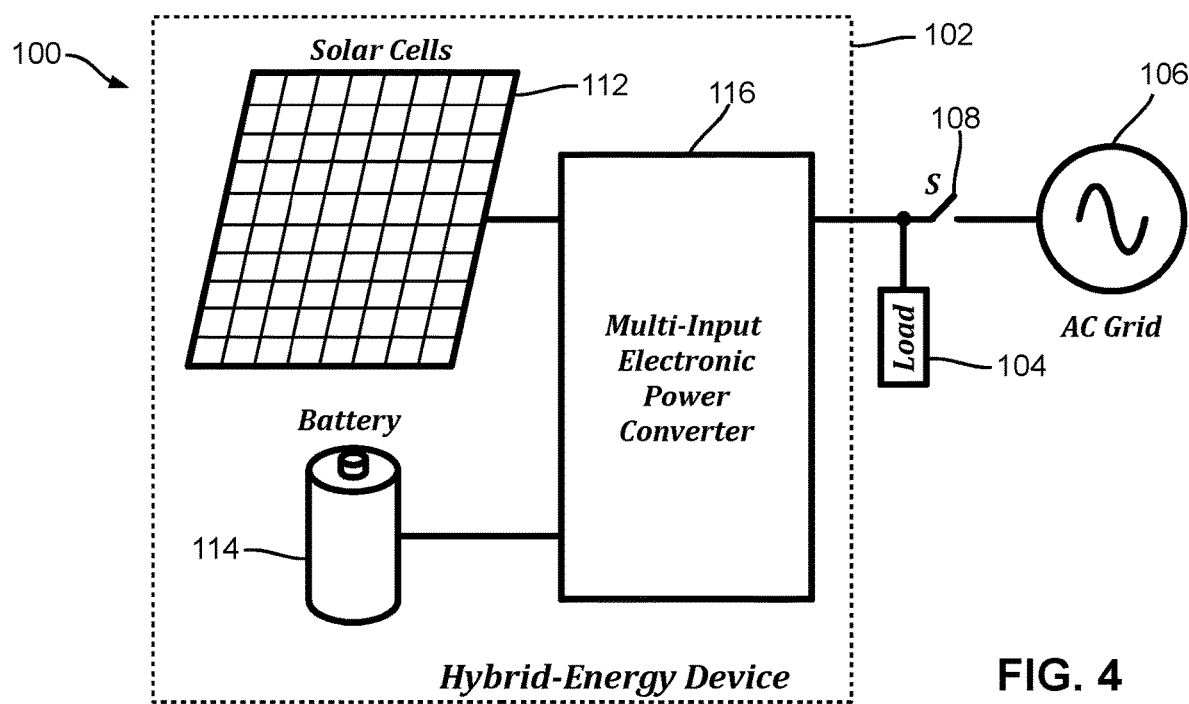
FIG. 4 shows a solar-energy harvesting system having a hybrid-energy device and connecting to a load and/or an AC utility grid, according to some embodiments of this disclosure.

Turning now to FIG. 4, a solar-energy harvesting system according to some embodiments of this disclosure is shown and is generally identified using reference numeral 100. As shown, the solar-energy harvesting system 100 comprises a hybrid-energy device 102 for powering a load 104.

The hybrid-energy device 102 is also connected to an Alternative-Current (AC) utility grid 106 through a switch 108. Therefore, when the switch 108 is closed, the hybrid-energy device 102 may output power to the AC utility grid 106 for powering various devices (not shown) electrically connected thereto or for using the AC utility grid 106 to power the load 104 when the output of the hybrid-energy device 102 is insufficient.

The hybrid-energy device 102 in these embodiments comprises a set of solar cells 112 such as a photovoltaic (PV) panel having a plurality of solar cells for harvesting solar energy and acting as a first energy source and comprises an energy storage 114 as a second energy source. The solar cells 112 and the energy storage 114 output electrical power to a multi-input electronic-power converter 116. The multi-input electronic-power converter 116 converts the received electrical power to a suitable form (e.g., having suitable voltage, current, frequency, phase, and/or the like) for powering the load 104 and/or outputting to the AC utility grid 106, and uses the output of the solar cells 112 to charge the energy storage 114. Moreover, the multi-input electronic-power converter 116 controls the power flow between different components.

Figure 5:
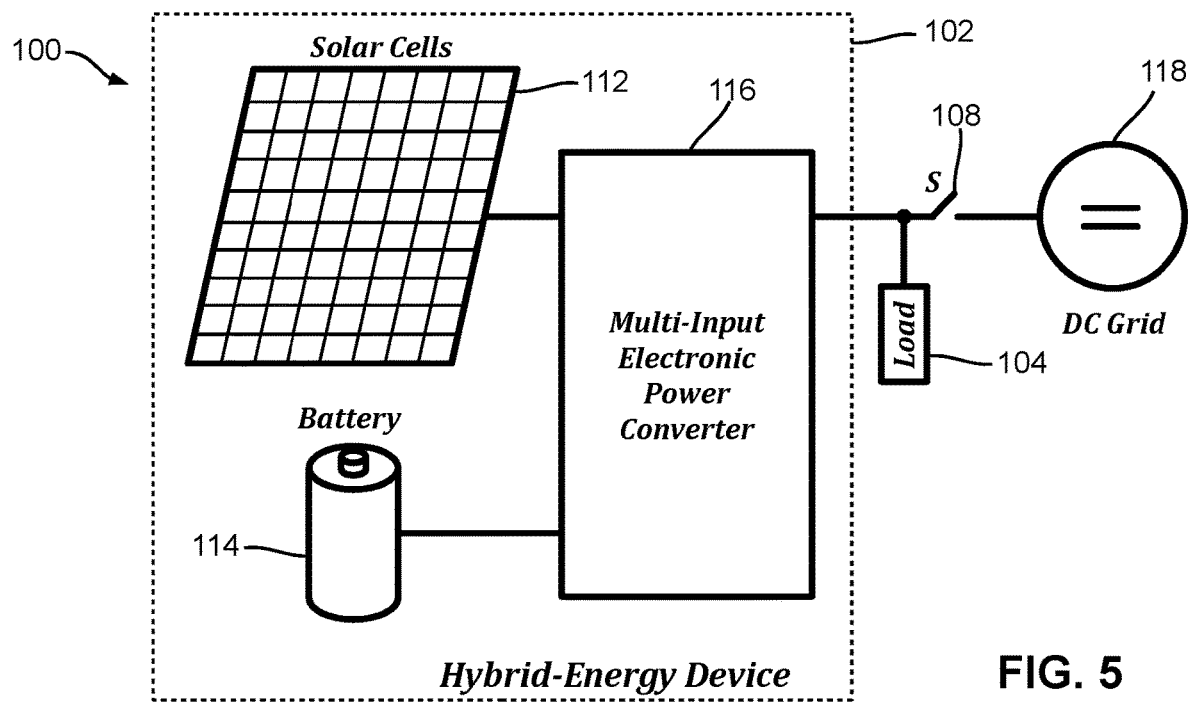
FIG. 5 shows a solar-energy harvesting system having a hybrid-energy device and connecting to a load and/or a DC utility grid, according to some embodiments of this disclosure.

FIG. 5 shows a solar-energy harvesting system 100 according to some embodiments of this disclosure. The solar-energy harvesting system 100 in these embodiments is similar to that shown in FIG. 4 except that the hybrid-energy device 102 is connected to a Direct-Current (DC) utility grid 118. The multi-input electronic-power converter 116 also controls the power flow between different components.

Figure 6A:
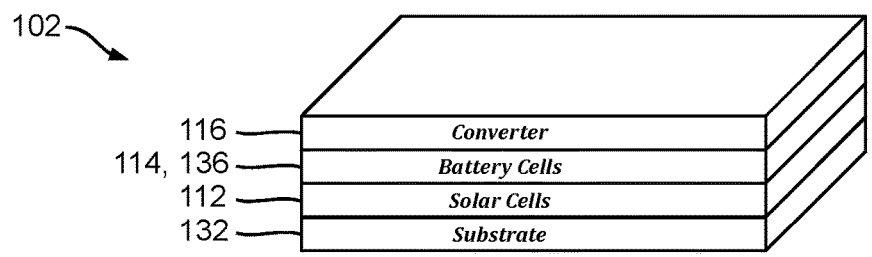
FIG. 6A is a schematic diagram showing the physical structure of the hybrid-energy device of the solar-energy harvesting system shown in FIGS. 4 and 5, according to some embodiments of this disclosure, wherein the hybrid-energy device comprises a layer of battery cells as the energy storage.
Figure 6B:
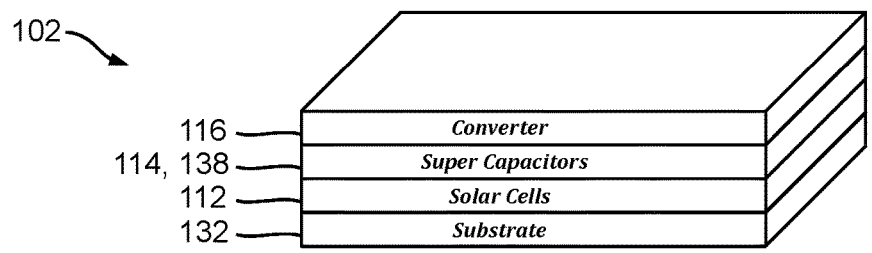
FIG. 6B is a schematic diagram showing the physical structure of the hybrid-energy device of the solar-energy harvesting system shown in FIGS. 4 and 5, according to some embodiments of this disclosure, wherein the hybrid-energy device comprises a layer of super capacitors as the energy storage.

The hybrid-energy device 102 shown in FIGS. 4 and 5 including the solar cells 112, energy storage 114, and multi-input electronic-power converter 116, is an integrated device printed, deposited, or otherwise coupled to a substrate and may have different implementations in different embodiments. FIGS. 6A and 6B are schematic diagrams showing the physical structures of the hybrid-energy device 102 with various energy storages 114 in different embodiments.

In the embodiments shown in FIG. 6A, the hybrid-energy device 102 comprises a substrate 132 made of one or more suitable transparent or semi-transparent materials such as glass, transparent or semi-transparent plastic, transparent or semi-transparent polymer, and/or the like. A layer of solar cells 112 (also denoted a "solar-cell layer") are printed, deposited, or otherwise coupled to the substrate 132. Thus, the transparent substrate 132 allows the solar-cell layer 112 to expose to ambient or incident light and provides support and protection to the solar-cell layer 112 and other layers coupled thereto.

In these embodiments, the energy storage 114 (also denoted an "energy-storage layer") comprises a layer of battery cells 136 printed, deposited, or otherwise coupled to the solar-cell layer 112. A layer of circuitry of the multi-input electronic-power converter 116 (denoted a "circuitry layer") coupled to the energy-storage layer 114. The solar-cell layer 112, energy-storage layer 114, and circuitry layer 116 are electrically connected (not shown) in accordance with FIG. 4 or FIG. 5.

The hybrid-energy device 102 in the embodiments shown in FIG. 6B is similar to that shown in FIG. 6A except that in these embodiments, the energy-storage layer 114 comprise one or more capacitors 138 or super capacitors (i.e., capacitors with large capacitances).

Figure 7A:
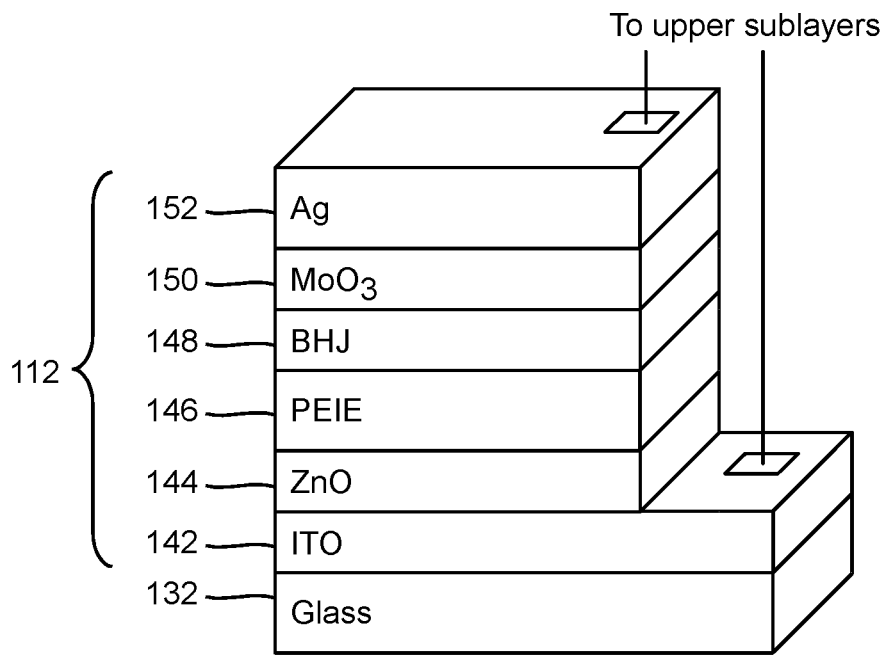
FIG. 7A is a schematic diagram showing the solar-cell layer and a substrate of the hybrid-energy device shown in FIGS. 6A and 6B, according to some embodiments of this disclosure, wherein the substrate is made of glass.

FIG. 7A is a schematic diagram showing the solar-cell layer 112 on a substrate 132 made of a suitable rigid, transparent or semi-transparent material such as glass. As shown, the solar-cell layer 112 comprises a plurality of sublayers such as, naming from the substrate 132, an anode sublayer 142 made of suitable material such as indium tin oxide (ITO) printed, deposited, or otherwise coupled to the substrate 132, a sublayer of zinc oxide (ZnO) 144, a sublayer of poly(ethylenimine) and poly(ethylenimine) ethoxylated (i.e., PEIE) 146, a sublayer of organic solar-cells 148 such as a sublayer of polymer solar-cells such as a sublayer of bulk heterojunctions (BHJs), a sublayer of molybdenum trioxide ($MoO_3$) 150, and a cathode sublayer 152 made of suitable material such as silver (Ag) or aluminum (Al). The anode 142 and the cathode 152 are electrically connected to upper layers such as the energy-storage layer 114 (i.e., the layer of battery cells 136 or capacitors 138) and/or the integrated-converter layer 116.

Figure 7B:
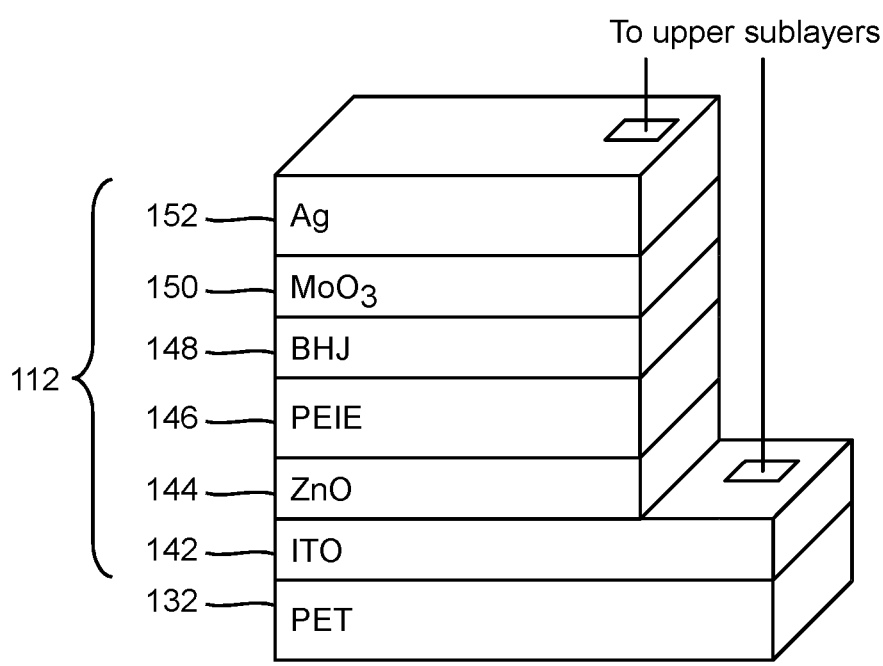
FIG. 7B is a schematic diagram showing the solar-cell layer and a substrate of the hybrid-energy device shown in FIGS. 6A and 6B, according to some embodiments of this disclosure, wherein the substrate is made of transparent or semi-transparent plastic.

FIG. 7B is a schematic diagram showing the solar-cell layer 112 on a substrate 132 made of a flexible, transparent or semi-transparent material such as a transparent or semi-transparent plastic material such as polyethylene terephthalate (PET, also denoted as poly(ethylene terephthalate)), poly(ether sulfones) (PES), and/or the like. The solar-cell layer 112 is the same as that shown in FIG. 7A.

The rigid substrate leads to solar cells of rigid structures, whereas the flexible substrate results in a flexible solar-cell structure. Those skilled in the art will appreciate that the flexible substrate provide many advantages such as:

1) ease of use in large-scale fabrication techniques such as roll-to-roll coating techniques for making solar cells and stencil-printing techniques for making batteries; and
2) flexible solar-cells allowing simplified fabrication process of all layers thereof.

In some embodiments, the solar-cell layer 112, energy-storage layer 114 (i.e., the layer of battery cells 136 or capacitors 138), and the integrated-converter layer 116 may be printed in large scale.

Figure 8:
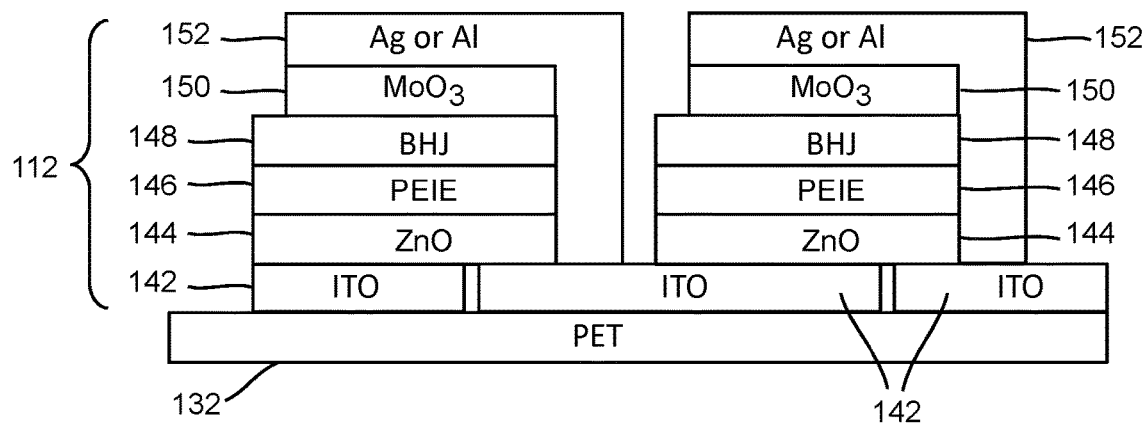
FIG. 8 is a schematic diagram showing a plurality of sublayers of the solar-cell layer shown in FIG. 7B printed in large scale on the substrate to form a plurality of solar cells.

FIG. 8 is a schematic diagram showing the above-described sublayers 142 to 152 of the solar-cell layer 112 printed in large scale on a substrate 132 to form a plurality of solar cells. First, an anode (ITO) sublayer 142 is printed onto the PET substrate 132 as a plurality of ITO blocks in a suitable pattern such as a matrix form. Then, a plurality of ZnO sublayers 144 are printed on top of the ITO sublayer with each ZnO block 144 coupled to a plurality of adjacent ITO blocks 142 such as ITO blocks 142 in neighboring rows thereby forming a parallel connection structure. Then, the PEIE, BHJ, and $MoO_3$ sublayers 146, 148, and 150 are sequentially printed as a plurality blocks on top of each other. Each set of PEIE, BHJ, and $MoO_3$ sublayers 146, 148, and 150 form a solar cell (without counting in the anode and cathode sublayers) printed on the anode sublayer 142.

The cathode (Ag or Al) sublayer 152 is finally printed onto the solar cells as a plurality of blocks with each cathode block extending to the anode layer 142 of the neighboring solar cell such that they are connected in series.

Figure 9:
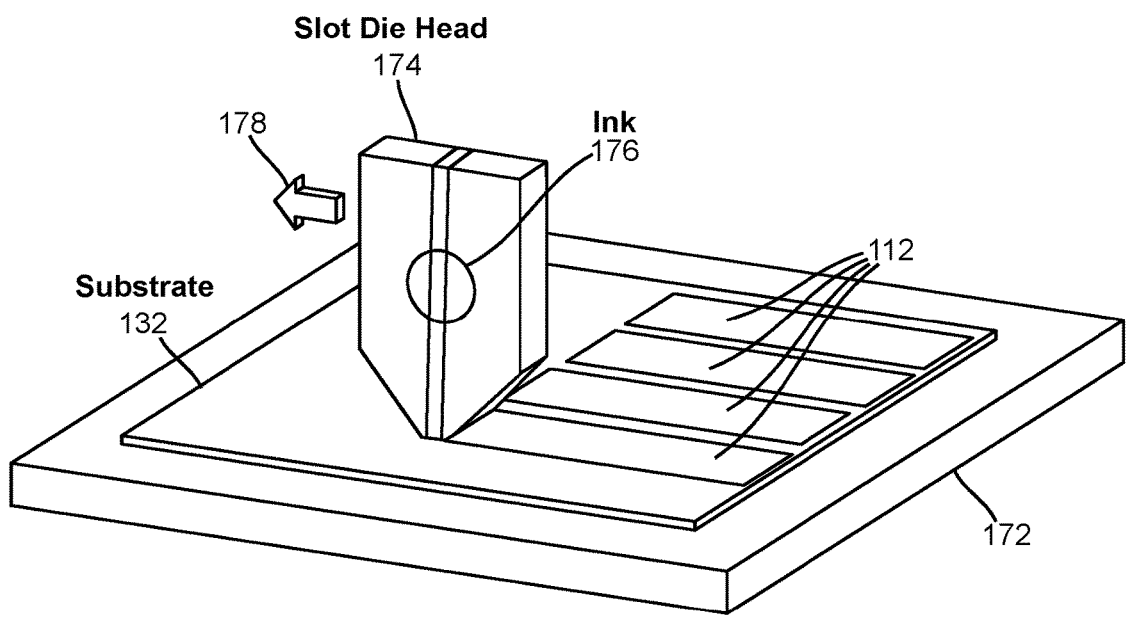
FIG. 9 is a conceptual diagram showing the printing of the solar-cell layer and the energy-storage layer of the hybrid-energy device shown in FIGS. 6A and 6B onto a substrate.

FIG. 9 is a conceptual diagram showing the printing of some sublayers such as the ZnO, PEIE, and BHJ sublayers 144, 146, and 148 of the solar-cell layer 112 onto the substrate 132. In these embodiments, the $MoO_3$ and Ag sublayers 150 and 152 are deposited by using a thermal evaporator.

As shown in FIG. 9, the substrate 132 is arranged on a flat surface of a platform 172. A printing device (not shown) with a slot-die head 174 is used for printing the sublayers/layers. The slot-die head 174 comprises a ink cartridge 176 filled with respective "ink" and moves (indicated by the arrow 178) on the substrate 132 (or a printed layer) to deposit the material from the ink cartridge 176 thereto to form solar cells 112 or energy storage cells (battery cells 136 and/or capacitors 138; not shown). In particular, the solar cells are first printed onto the substrate 132 to form the solar-cell layer 112 and then the energy-storage layer 114 (i.e., battery cells 136 and/or capacitors 138) are printed onto the solar-cell layer 112. Then, the multi-input electronic-power converter 116 (in the form of a printed circuit board) is coupled to the energy-storage layer 114.

Herein, the "ink" refers to sublayer/layer material in a suitable form such as a solution, a gel, or powder that is used as a precursor for the fabrication of sublayers/layers. For example, an ink of ZnO dissolved in butanol may be deposited by slot-die coating for forming the ZnO sublayer 144 of the solar-cell layer 112. During the slot-die fabrication of each sublayer, heat treatment is usually used for evaporating the solvent or for melting the powders to solidify the fabricated sublayer.

Figure 10:
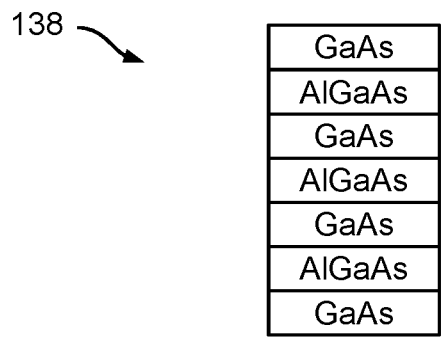
FIG. 10 shows the structure of the super capacitor shown in FIG. 6B.

In the embodiments shown in FIG. 6B, super capacitors 138 are used as the energy-storage layer 114. FIG. 10 shows the structure of the super capacitor 138. As shown, the energy-storage layer 114 or super capacitors 138 comprises a plurality of gallium arsenide (GaAs)/aluminum gallium arsenide (AlGaAs) sublayers, such as n sublayers of AlGaAs (n>0 is an integer) and (n+1) sublayers of GaAs with each AlGaAs sublayer sandwiched between two neighboring GaAs sublayers, thereby forming a plurality of semiconductor capacitors.

Each GaAs or AlGaAs sublayer may be deposited by using suitable techniques such as DC sputtering, radio-frequency (RF) sputtering, thermal evaporation, and/or the like.

Figure 11A:
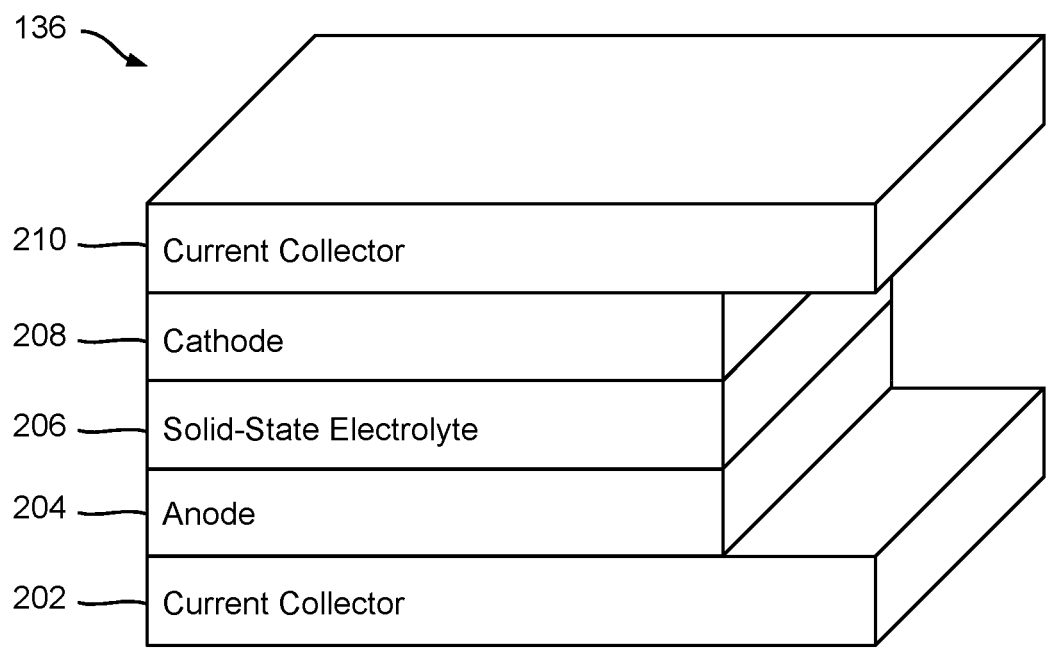
FIG. 11A is a schematic diagram showing the structure of a battery cell of the energy-storage layer of the hybrid-energy device shown in FIG. 6A.

FIG. 11A is a schematic diagram showing the structure of a battery cell 136 of the energy-storage layer 114 in the embodiments shown in FIG. 6A. As shown, each battery cell 136 comprises a plurality of sublayers including a pair of current-collector sublayers 202 and 210 coupled to an anode sublayer 204 and a cathode sublayer 208, respectively, and a solid-state electrolyte sublayer 206 sandwiched between the anode and cathode sublayers 204 and 208.

The electrical current flows through the current-collector sublayer 202, anode sublayer 204, solid-state electrolyte sublayer 206, cathode sublayer 208, and current-collector sublayer 210. The anode sublayer 204 is the negative or reducing electrode that releases electrons to the external circuit and oxidizes during and electrochemical reaction. The cathode sublayer 208 is the positive or oxidizing electrode that acquires electrons from the external circuit and is reduced during the electrochemical reaction.

The solid-state electrolyte sublayer 206 is the medium that provides the ion-transport mechanism between the cathode 208 and anode 204 of the battery cell 136. Compared to the liquid-form electrolytes which comprise solvents dissolving salts, acids, or alkalis for ionic conduction and are usually flammable, solid-state electrolyte is safer and the resulting battery assembly may be more compact as fewer safety-monitoring and/or safety-prevention components and/or subsystems are needed. Batteries using solid-state electrolyte also provides improved energy and power densities.

Figure 11B:
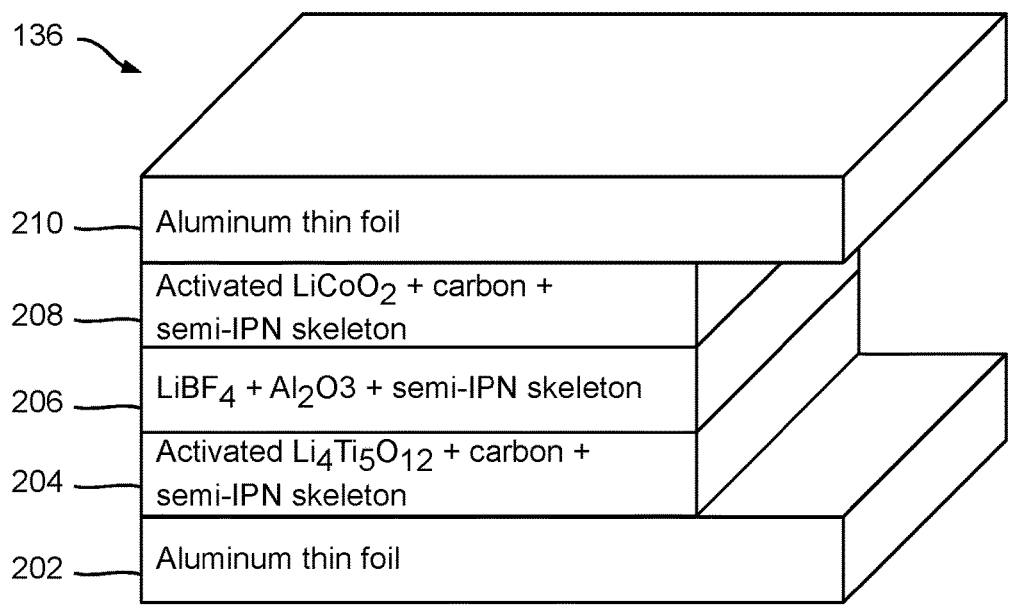
FIG. 11B is a schematic diagram showing the structure of the battery cell shown in FIG. 11A in the form of a Li-ion battery cell.

FIG. 11B is a schematic diagram showing the structure of the battery cell 136 in the form of a Li-ion battery cell. In this embodiment, the current-collector sublayers 202 and 210 are thin layers of aluminum foil, the anode sublayer 204 comprises activated $Li_4Ti_5O_{12}$ (i.e., LTO) with carbon (comprising single-walled carbon nanotubes (SWCNT) and carbon powder; described in more detail below) and a semi-interpenetrating polymer network (SIPN or semi-IPN) skeleton, the cathode sublayer 208 comprises activated $LiCoO_2$ (i.e., Lithium Cobalt Oxide or LCO) with carbon (comprising SWCNT and carbon powder; described in more detail below) and a semi-IPN skeleton, and the solid-state electrolyte sublayer 206 comprises $LiBF_4$ with $Al_2O_3$ and a semi-IPN skeleton.

The semi-IPN skeleton is an ultraviolet (UV) curable polymer which is composed of ethoxylated trimethylolpropane triacrylate (i.e., ETPTA) incorporating 1.0 weight percent (wt %) 2-hydroxy-2-methylpropiophenone (HMPP) as a photoinitiator and poly(vinylidene fluoride-co-hexafluoropropylene) (i.e., PVdF-HFP) with HFP content of six (6) mole percent (mol %) and ETPTA/PVdF-HFP at a ratio of 75/25 weight-by-weight (w/w). The semi-IPN skeleton acts as binder for other materials in electrodes and electrolyte.

In order to increase the conductivity of LCO and LTO, the electrode-active LCO or LTO powder (e.g., nanoparticles) is coated with SWCNT. Specifically, the LCO or LTO powder is added into a SWCNT-suspension solution (LCO/SWCNT at a ratio of 99.75/0.25 w/w, LTO/SWCNT at a ratio of 99.35/0.65 w/w) and mixed. The mixed solution is then filtered to obtain solids which are rinsed and dried to obtain the SWCNT-coated LCO (i.e., activated LCO) or SWCNT-coated LTO (i.e., activated LTO).

An electrode paste for making the cathode sublayer 208 is then formed by mixing the SWCNT-coated LCO nanoparticles with carbon black (i.e., carbon powder) and semi-IPN skeleton (at a ratio of 55/6/39 w/w/w). An electrode paste for making the anode sublayer 204 is then formed by mixing the SWCNT-coated LTO nanoparticles with carbon black (i.e., carbon powder) and semi-IPN skeleton (at a ratio of 30/7/63 w/w/w). Herein, carbon black is used to increase the conductivity of electrodes.

The solid-state electrolyte sublayer 206 comprises 1 Molar (mol per liter; M) $LiBF_4$ in Sebaconitrile (SBN) and semi-IPN skeleton at a ratio of 85/15 w/w, the aggregation of which is then mixed with $Al_2O_3$ (about 300 Molar) at a ratio of 60/40 w/w. $Al_2O_3$ is used as a spacer to prevent any short-circuit of electrodes.

Figure 12:
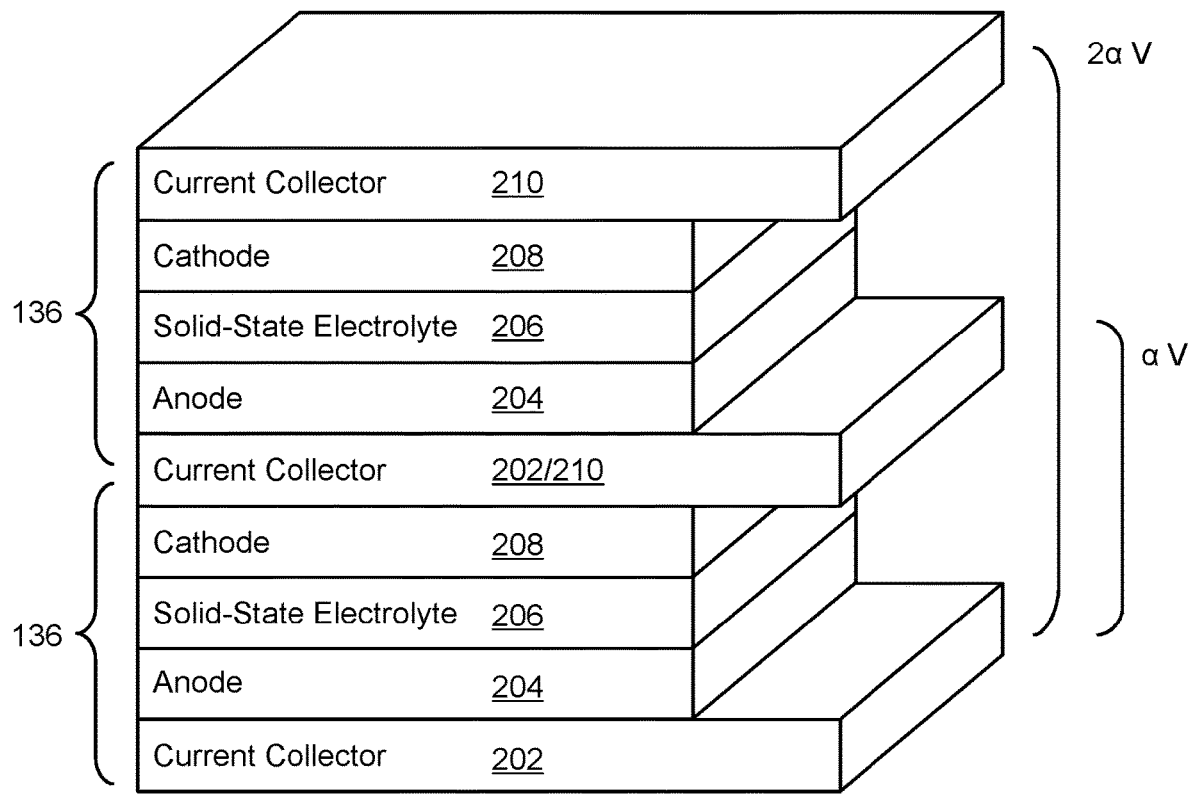
FIG. 12 is a schematic diagram showing two battery cells printed on top of each other in series and sharing a common current-collector sublayer therebetween.

FIG. 12 is a schematic diagram showing two battery cells 136 printed on top of each other in series and sharing a common current-collector sublayer (denoted 202/210) therebetween. Each battery cell 136 has an output voltage of α volts (V), and the combined voltage of the two battery cells 136 is 2α V.

Figure 13:
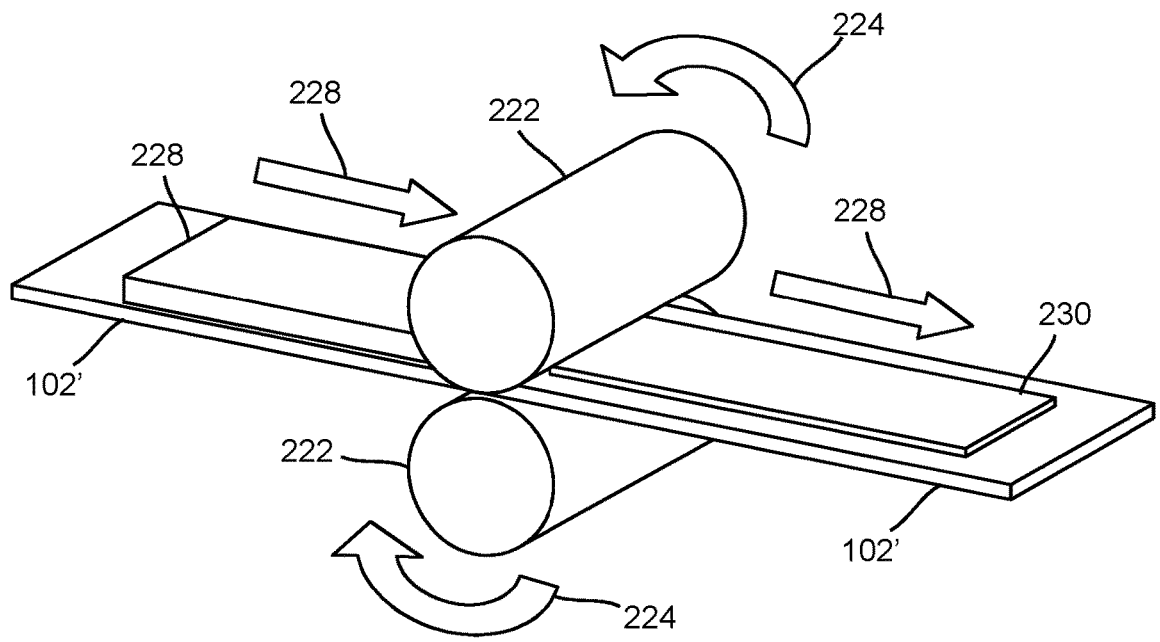
FIG. 13 shows the stencil printing technology for making battery cells by using a cold manual laminator as a stencil printer device.

FIG. 13 shows the stencil printing technology for making battery cells 136 by using a cold manual laminator as a stencil printer device. In particular, a pair of rollers 222 are rotating as indicated by the arrows 224 to apply pressure to the hybrid-energy device to be manufactured (identified using reference numeral 102'; having the substrate 132 and the solar-cell layer 112 printed thereon) which is fed to the rollers 222 as indicated by the arrows 228. The feeding hybrid-energy device 102' is prepared with copper masks (not shown) overlaid thereon. Then, a gel or paste having the above-described material of respective one of the sublayers 204 to 208 is applied to the masked hybrid-energy device 102'. After passing through the rollers 222, a thin layer 230 of the gel (with a thickness of about 100 μm) is thus printed or coated onto the masked hybrid-energy device 102'.

Figure 14:
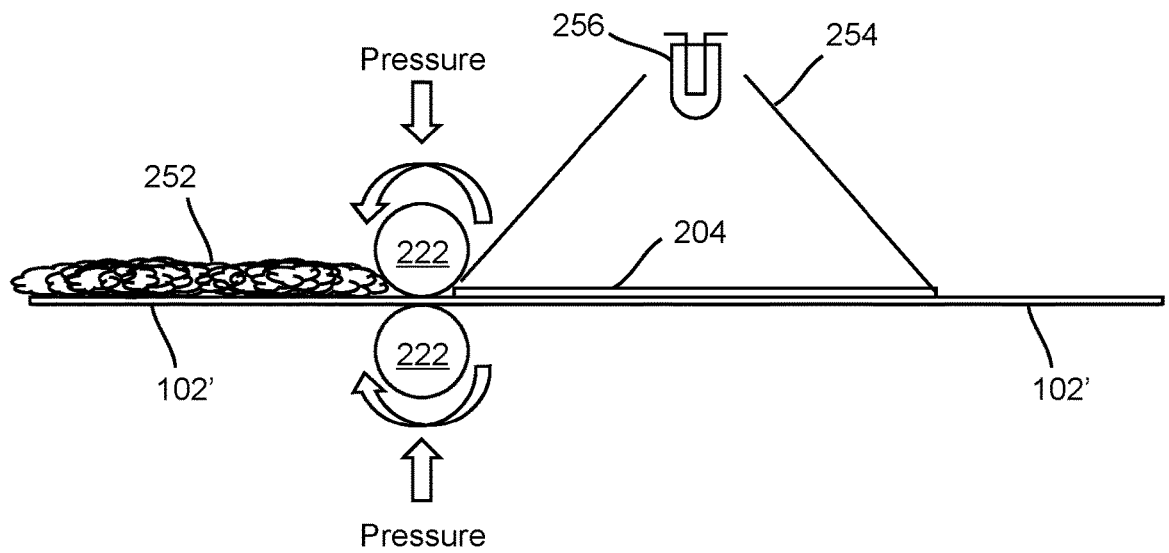
FIG. 14 shows the fabrication process of the anode sublayer on top of the aluminum current-collector sublayer using the stencil printing technique shown in FIG. 13 without any processing solvents.

FIG. 14 shows the fabrication process of the anode sublayer 204 on top of the aluminum current-collector sublayer 202 using the above-described stencil printing technique without any processing solvents. As shown, a LTO anode paste 252 is applied to the feeding hybrid-energy device 102' having the aluminum current-collector sublayer 202 (not shown), the rotating rollers 222 apply a pressure onto the anode paste 252 passing therethrough to form a thin LTO film 204 which is then exposed to UV irradiation 254 from a Hg UV-lamp 256 with an irradiation peak intensity of approximately 2000 mW·$cm^{-2}$ for 30 seconds to solidify and form the printed LTO anode sublayer 204.

Then, the hybrid-energy device 102' may be masked and applied with an electrolyte paste and fed through the rollers 222 in a similar stencil-printing and UV-curing process as described above to print the solid-state electrolyte sublayer 206 on the anode sublayer 204. The cathode sublayer 208 may be then fabricated by printing a cathode paste onto the solid-state electrolyte sublayer 206 of the hybrid-energy device 102' and cured by UV irradiation. After the Al current-collector sublayer 210 is placed on top of the printed cathode sublayer 208, a seamlessly integrated all-solid-state battery-cell layer 136 is obtained which may be a mono full cell, i.e., the entire batter-cell layer 136 comprising a single battery cell.

The above-described process may be repeated to print another battery-cell layer 136 on top, giving rise to printed bipolar battery-cells 136.

In some embodiments, the above-described printing device with the slot-die head 174 shown in FIG. 9 may be used for printing the sublayers of battery cells 136. In these embodiments, a specific head 174 may be used for printing all the sublayers of solid-state battery cells 136 using slot-die coating. However, stencil printing (see FIG. 13) is much easier to use with high-viscosity inks. Moreover, it is not necessary to coat thin (i.e., nm scale) layers to fabricate the batteries disclosed herein. The sublayers of battery cells 136 may have relatively large thickness in ranges of micrometers that may be easily achieved by using stencil printing.

Figure 15:
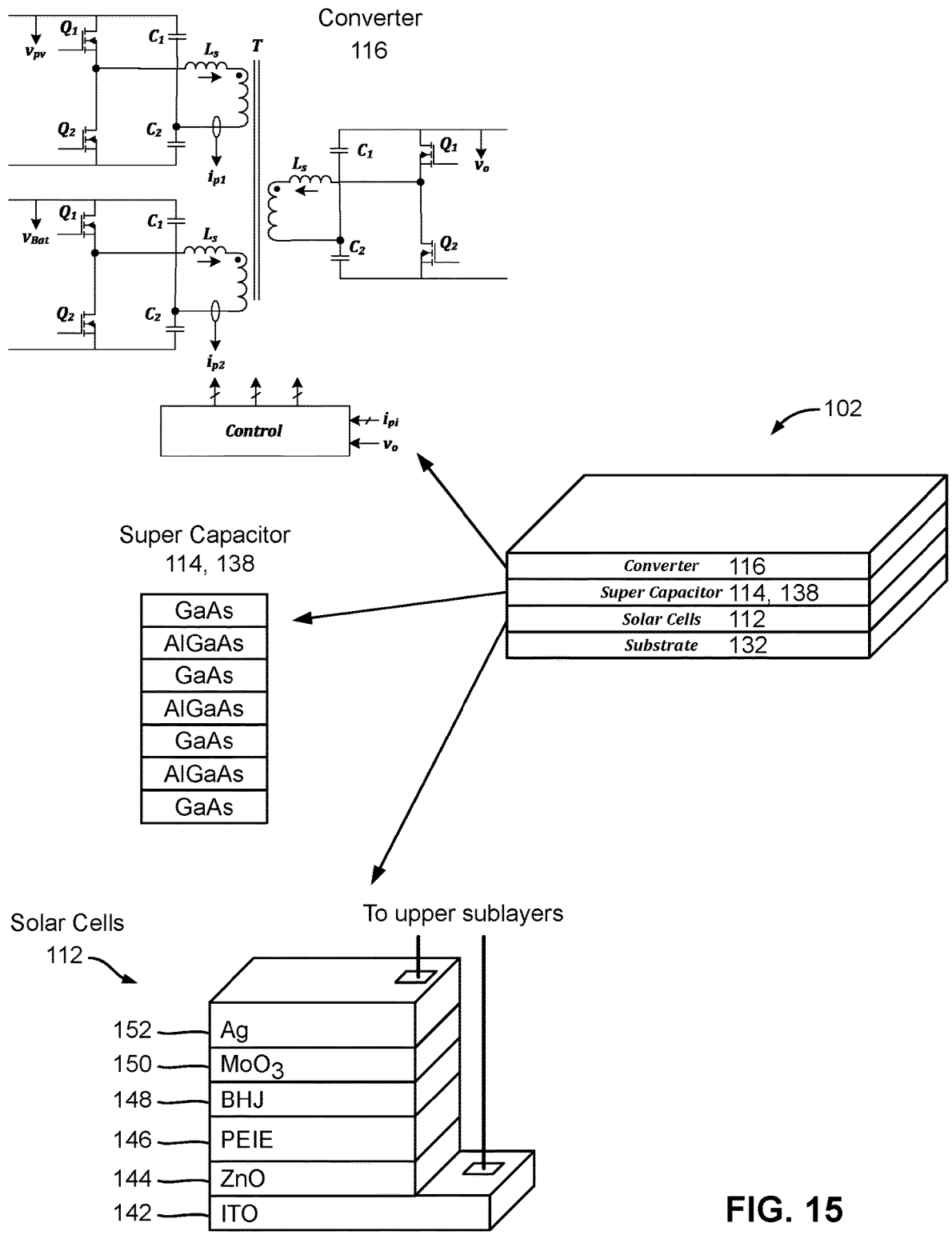
FIG. 15 is a schematic diagram showing the details of the hybrid-energy device shown in FIGS. 6A and 6B.

FIG. 15 shows the details of the hybrid-energy device 102. In this example, the energy-storage layer 114 is a super capacitor layer comprising a plurality of GaAs/AlGaAs sublayers 138 forming a plurality of semiconductor capacitors as described above.

Figure 16A:
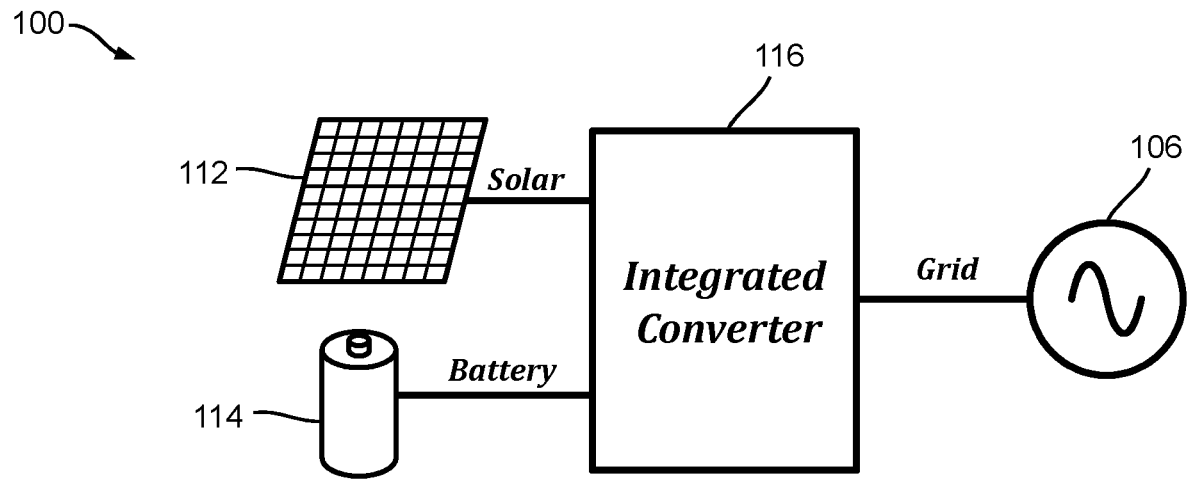
FIGS. 16A and 16B are block diagrams of a solar-energy harvesting system having an integrated electronic-power converter for AC and DC applications.
Figure 16B:
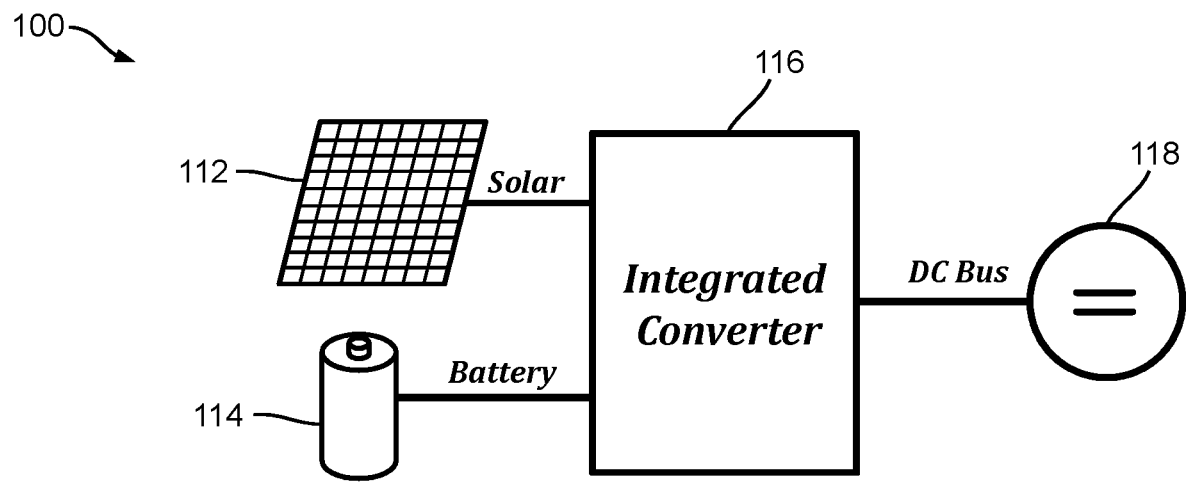

In some embodiments, the multi-input electronic-power converter 116 may be an integrated electronic-power converter that may be printed, deposited, or otherwise integrated to the layer of battery cells 136 (see FIGS. 6A and 6B). The block diagram of the integrated electronic-power converter is shown in FIGS. 16A and 16B which show the solar-energy harvesting system 100 having an integrated electronic-power converter 116 for AC and DC applications, respectively.

Figure 17A:
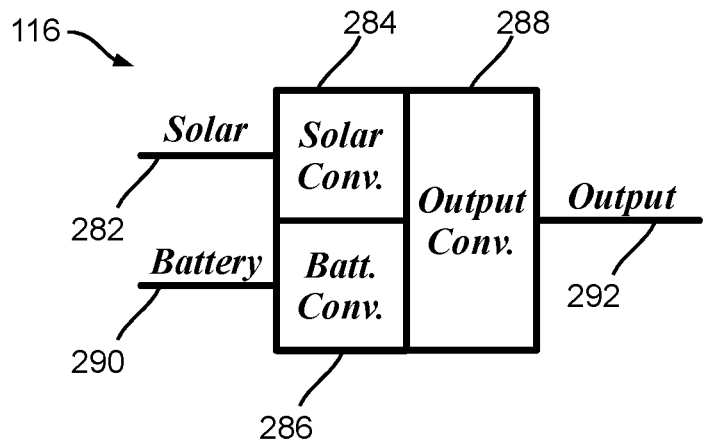
FIG. 17A is a schematic diagram showing the functional structure of the integrated electronic-power converter shown in FIGS. 16A and 16B, wherein the integrated electronic-power converter comprises a solar-input converter, a battery-input converter, and an output converter.

FIG. 17A is a block diagram of the integrated electronic-power converter 116. As shown, the integrated electronic-power converter 116 comprises a solar-input converter 284 receiving the output of the solar-cell layer 112 at a solar input 282 and converting the solar input 282 to a first intermediate form (voltage, current, frequency, phase, and/or the like) for outputting to an output converter 288. The integrated electronic-power converter 116 also comprises a battery-input converter 286 receiving the output of the energy-storage layer 114 at a battery input 290 and converting the battery input 290 to a second intermediate form (voltage, current, frequency, phase, and/or the like) for outputting to the output converter 288. The output converter 288 receives and combines the electrical outputs from the solar-input converter 284 and the battery-input converter 286 and converts the combined electrical energy into a suitable form (voltage, current, frequency, phase, and/or the like) for outputting (292) to the load and/or utility grid (not shown).

Figure 17B:
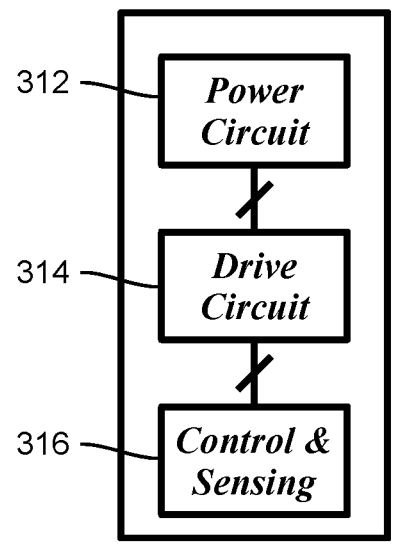
FIG. 17B is a schematic diagram showing the functional structure of the solar-input converter, the battery-input converter, and the output converter shown in FIG. 17A.

In these embodiments, the solar-input converter 284, the battery-input converter 286, and the output converter 288 are high-frequency circuitries and have a similar functional structure as shown in FIG. 17B. As can be seen, each of the converters 284, 286, and 288 comprises a power circuit 312 for receiving electricity input. The power circuit 312 is coupled to a drive circuit 314 for outputting electricity. A control and sensing module 316 is coupled to the drive circuit 314 for controlling the electricity output and for balancing between the solar input 282 and the battery input 290.

Figure 17C:
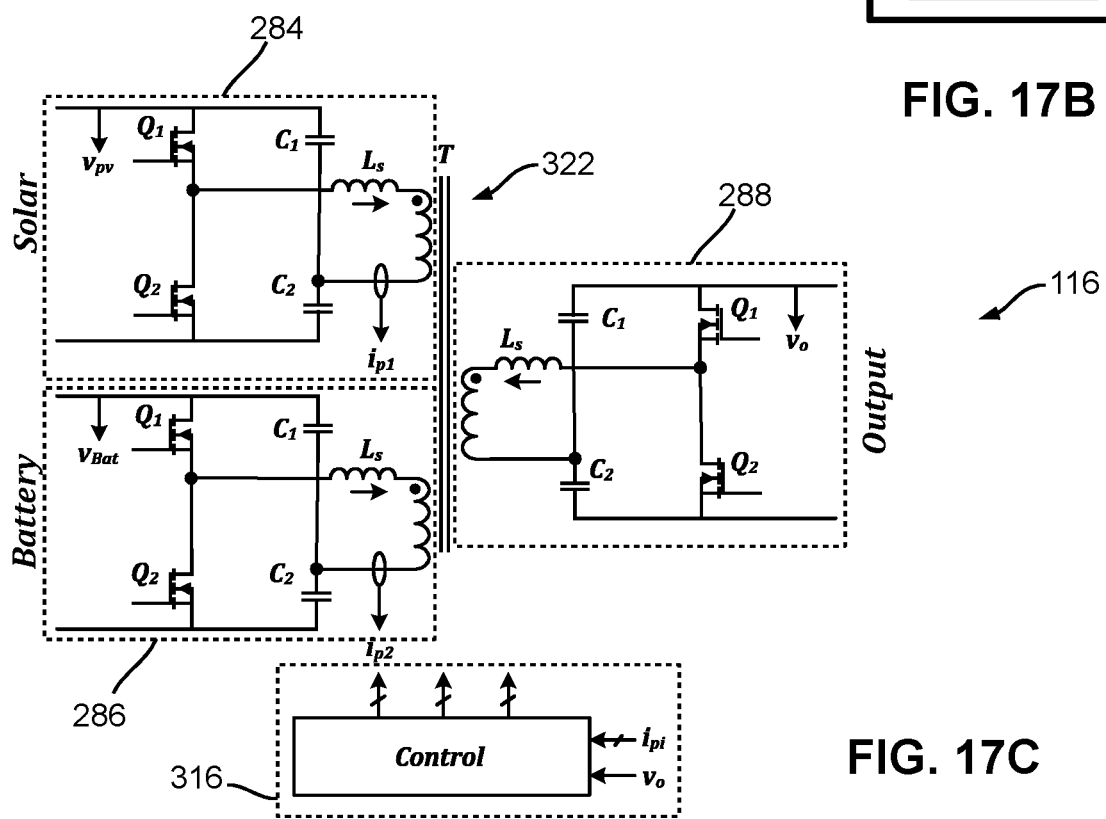
FIG. 17C is a circuit diagram of the integrated electronic-power converter shown in FIGS. 16A and 16B.

FIG. 17C is a circuit diagram of the integrated electronic-power converter 116. As shown, the solar-input converter 284, the battery-input converter 286, and the output converter 288 are electrically coupled through a transformer 322 with a ferromagnetic or ferrimagnetic core.

Figure 18A:
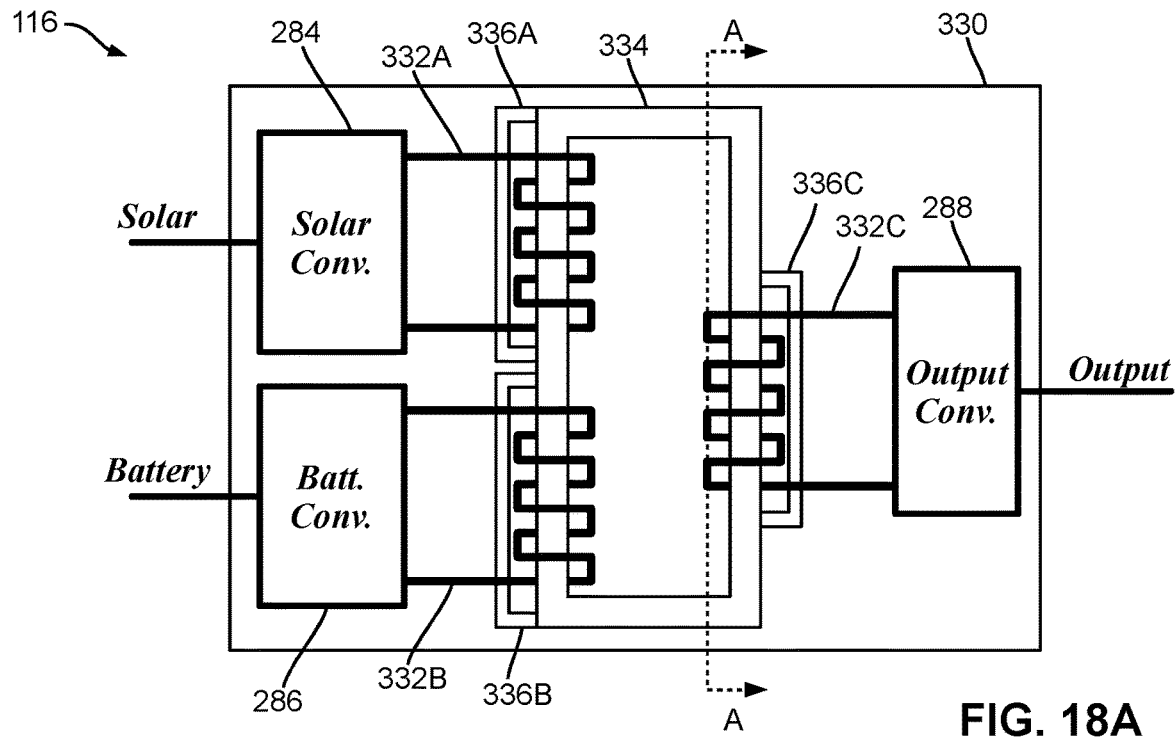
FIG. 18A is a schematic diagram showing a physical implementation of the integrated electronic-power converter shown in FIGS. 16A and 16B, according to some embodiments of this disclosure.
Figure 18B:
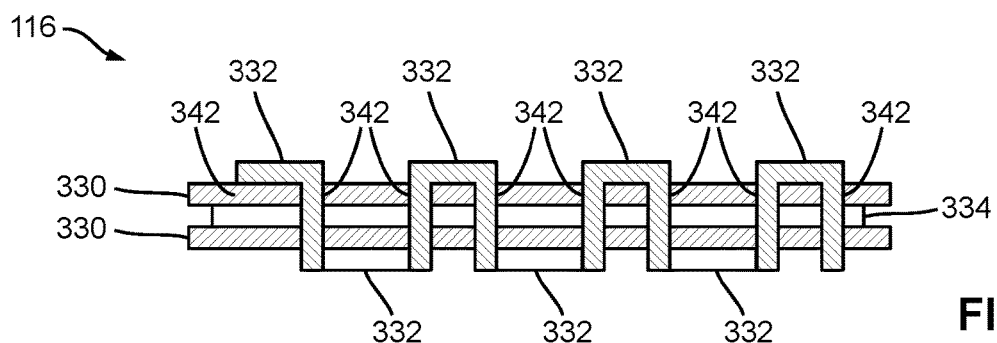
FIG. 18B is a cross-sectional view of the integrated electronic-power converter shown in FIG. 18A along the cross-sectional line A-A.
Figure 18C:
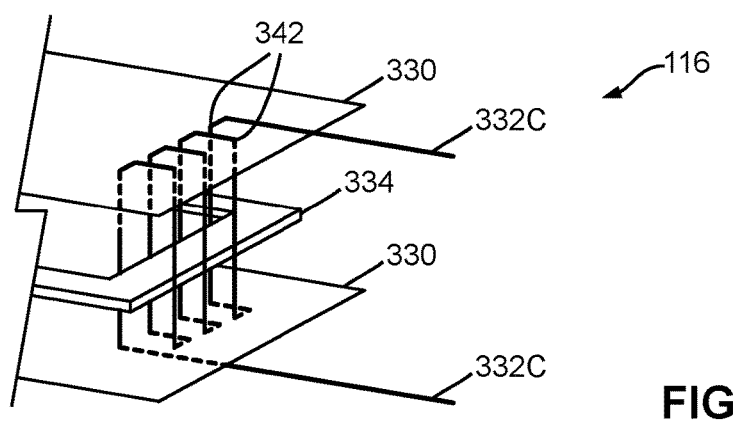
FIG. 18C is a schematic perspective view of a portion of the integrated electronic-power converter shown in FIG. 18A, according to some embodiments of this disclosure.

As shown in FIGS. 18A to 18C, the integrated electronic-power converter 116 in some embodiments may be formed by a printed circuitry on a plurality of flexible printed circuit boards (PCBs) 330.

In these embodiments, the integrated electronic-power converter 116 is implemented as an Integrated Circuit (IC) chip and comprises a core layer 334 made of a ferrite material thereby forming a ferrite core. The ferrite core 334 is sandwiched between two silicon-based wiring layers 330. FIG. 18C is a schematic perspective view of a portion of the integrated electronic-power converter 116. For ease of illustration, the structure of the integrated electronic-power converter 116 is shown with gaps between the ferrite core 334 and the wiring layers 330. However, those skilled in the art will appreciate that such gaps are for illustration purposes only and the actual integrated electronic-power converter 116 may not have any gap between the ferrite core 334 and the wiring layers 330. For example, the ferrite core 334 may be printed, deposited, or otherwise integrated to either one of the wiring layers 330.

The ferrite core 334 comprises three ferrite loops 336A, 336B, and 336C for acting as the cores of the inductors Ls of the solar-input, battery-input, and output converters 284, 286, and 288, respectively.

The conductive wirings 332 including 332A, 332B, and 33C are distributed on the wiring layers 330 and connect the solar-input, battery-input, and output converters 284, 286, and 288. As shown in FIGS. 18B and 18C, the conductive wirings 332 on the opposite wiring layers 330 are connected through vias 342 (conductive holes on the wiring layers 330) and winding about the ferrite core 334.

In some embodiments, the integrated electronic-power converter 116 is implemented as a circuit board having two wiring layers 330 made of flexible PCBs and a core layer 334 structured in a manner similar to that shown in FIGS. 18A to 18C and described above. The conductive wirings 332 including 332A, 332B, and 33C are made of etched conductive layers on the flexible PCBs 330. The conductive wirings 332 on the opposite flexible PCBs 330 are connected through vias 342 and winding about the ferrite core 334.

Although in above embodiments, the solar-cell layer 112 comprises a ZnO sublayer 144 and a PEIE sublayer 146, in some alternative embodiments, the solar-cell layer 112 may only comprise a ZnO sublayer 144 or a PEIE sublayer 146. However, the performance of the solar-cell layer 112 in these embodiments may be decreased.

Although embodiments have been described above with reference to the accompanying drawings, those of skill in the art will appreciate that variations and modifications may be made without departing from the scope thereof as defined by the appended claims.

What is claimed is:

1. An integrated multi-layer energy apparatus comprising:
   a transparent or semi-transparent substrate;
   a solar-cell layer coupled to the substrate, the solar-cell layer comprising a plurality of solar cells for receiving light through the substrate and converting energy of the received light to a first electrical energy;
   an energy-storage layer coupled to the solar-cell layer, the energy-storage layer comprising one or more energy-storage units for storing a second electrical energy; and
   a converter layer comprising, in a single layer, a solar-input converter electrically connected to the solar-cell layer, a battery-input converter electrically connected to the energy-storage layer, and an output converter configured to receive the first electrical energy and the second electrical energy and convert the first electrical energy and the second electrical energy into a third electrical energy;
   wherein the solar-input converter, the battery-input converter, and the output converter are coupled to a ferrite core comprising a first ferrite loop, a second ferrite loop, and a third ferrite loop, each of the first and second ferrite loops sharing a portion of the third ferrite loop; and
   wherein the solar-input converter comprises coils winding around the first ferrite loop, the battery-input converter comprises coils winding around the second ferrite loop, and the output converter comprises coils winding around the third ferrite loop.

2. The multi-layer energy apparatus of claim 1, wherein the substrate comprises a layer of glass or a flexible, transparent or semi-transparent material.

3. The multi-layer energy apparatus of claim 1, wherein the substrate comprises a transparent or semi-transparent plastic material.

4. The multi-layer energy apparatus of claim 1, wherein the substrate comprises at least one of polyethylene terephthalate (PET) and poly(ether sulfones) (PES).

5. The multi-layer energy apparatus of claim 1, wherein the solar-cell layer is printed or deposited to the substrate.

6. The multi-layer energy apparatus of claim 1, wherein the energy-storage layer is printed or deposited to the solar-cell layer.

7. The multi-layer energy apparatus of claim 1 wherein the solar-cell layer comprises:
   an anode sublayer coupled to the substrate;
   a sublayer of zinc oxide (ZnO) coupled to the anode sublayer;
   a sublayer of poly(ethylenimine) and poly(ethylenimine) ethoxylated (PEIE) coupled to the sublayer of ZnO;
   a sublayer of organic solar cells coupled to the sublayer of PEIE;
   a sublayer of molybdenum trioxide ($MoO_3$) coupled to the sublayer of solar cells; and
   a cathode sublayer coupled to the sublayer of $MoO_3$.

8. The multi-layer energy apparatus of claim 7, wherein the anode sublayer comprises indium tin oxide (ITO).

9. The multi-layer energy apparatus of claim 7, wherein the cathode sublayer comprises silver (Ag) or aluminum (Al).

10. The multi-layer energy apparatus of claim 7, wherein the sublayer of organic solar cells comprises polymer solar cells.

11. The multi-layer energy apparatus of claim 7, wherein the sublayer of organic solar cells comprises a sublayer of bulk heterojunctions (BHJs).

12. The multi-layer energy apparatus of claim 1, wherein the energy-storage layer comprises at least one of one or more battery cells and one or more semiconductor capacitors.

13. The multi-layer energy apparatus of claim 12, wherein each of the one or more semiconductor capacitors comprise n aluminum gallium arsenide (AlGaAs) sublayers interleaved with (n+1) gallium arsenide (GaAs) sublayers, n>0 being an integer, with each AlGaAs layer sandwiched between two neighboring GaAs layers.

14. The multi-layer energy apparatus of claim 12, wherein each of the one or more battery cells comprises:
   a first current-collector sublayer;
   an anode sublayer coupled to the first current-collector sublayer;
   a solid-state electrolyte sublayer coupled to the anode sublayer;
   a cathode sublayer coupled to the solid-state electrolyte sublayer; and
   a second current-collector sublayer coupled to the cathode sublayer.

15. The multi-layer energy apparatus of claim 14, wherein at least one of the first and the second current-collector sublayers comprises aluminum.

16. The multi-layer energy apparatus of claim 14, wherein each solid-state electrolyte sublayer comprises $LiBrF_4$ with $Al_2O_3$ and a first semi-interpenetrating polymer network (semi-IPN) skeleton material.

17. The multi-layer energy apparatus of claim 14, wherein each solid-state electrolyte sublayer is made of 1 Molar (mol per liter) LiBrF$_4$ in Sebaconitrile (SBN) and a first semi-IPN skeleton material at a ratio of 85/15 weight-by-weight (w/w), mixed with about 300 Molar Al$_2$O$_3$ at a ratio of 60/40 w/w.

18. The multi-layer energy apparatus of claim 17, wherein the semi-IPN skeleton material comprises an ultraviolet (UV) curable polymer.

19. The multi-layer energy apparatus of claim 18, wherein the UV-curable polymer comprises ethoxylated trimethylolpropane triacrylate (ETPTA) incorporating 1.0 weight percent (wt %) 2-hydroxy-2-methylpropiophenone (HMPP) and poly(vinylidene fluoride-co-hexafluoropropylene) (PVdF-HFP) with HFP of six mole percent (mol %) and ETPTA/PVdF-HFP at a ratio of 75/25 weight-by-weight (w/w).

20. The multi-layer energy apparatus of claim 14, wherein the anode sublayer of each of the one or more battery cells comprises activated Li$_4$T$_{15}$O$_{12}$ (LTO) with a first carbon material and a second semi-IPN skeleton material.

21. The multi-layer energy apparatus of claim 20, wherein the first carbon material comprises at least one of single-walled carbon nanotubes (SWCNT) and carbon powder.

22. The multi-layer energy apparatus of claim 21, wherein the activated LTO is SWCNT-coated LTO.

23. The multi-layer energy apparatus of claim 21, wherein the cathode sublayer of the one or more battery cells comprises activated LiCoO$_2$ (LCO) with a second carbon material and a third semi-IPN skeleton material; and wherein the activated LCO is SWCNT-coated LCO.

24. The multi-layer energy apparatus of claim 14, wherein the cathode sublayer of each of the one or more battery cells comprises activated LiCoO$_2$ (LCO) with a second carbon material and a third semi-IPN skeleton material.

25. The multi-layer energy apparatus of claim 24, wherein the second carbon material comprises at least one of SWCNT and carbon powder.

26. The multi-layer energy apparatus of claim 1, wherein the ferrite core forms a core layer sandwiched between two wiring layers; wherein each of the wiring layers comprises electrically conductive wirings on a base; wherein the electrically conductive wirings form the coils of the solar-input converter, the battery-input converter, and the output converter; and wherein the wirings of the two wiring layers are interconnected through one or more vias thereon.

* * * * *